United States Patent
Huang et al.

(10) Patent No.: US 6,504,716 B2
(45) Date of Patent: Jan. 7, 2003

(54) MOVABLE MECHANISM FOR USING WITH ELECTRICAL APPARATUS TO BE DISSIPATED

(75) Inventors: Chin-Chu Huang, Taoyuan Shien (TW); Chen-Yu Yu, Taoyuan Shien (TW)

(73) Assignee: Delta Electronics Inc., Taoyuan Shien (TW)

( * ) Notice: Subject to any disclaimer, the term of this patent is extended or adjusted under 35 U.S.C. 154(b) by 0 days.

(21) Appl. No.: 09/819,305

(22) Filed: Mar. 27, 2001

(65) Prior Publication Data

US 2002/0141154 A1 Oct. 3, 2002

(51) Int. Cl.$^7$ ................................................ H05K 7/20
(52) U.S. Cl. ...................... 361/695; 415/213.1; 454/184
(58) Field of Search ................................. 165/121, 122; 62/259.2; 361/687–688, 694–695; 454/184; 415/213.1, 214.1, 220; 417/360, 423.5, 423.15, 477.2

(56) References Cited

U.S. PATENT DOCUMENTS

| | | | | | |
|---|---|---|---|---|---|
| 4,383,286 A | * | 5/1983 | Hicks | .......................... | 361/694 |
| 5,822,186 A | * | 10/1998 | Bull et al. | .................. | 361/695 |
| 6,186,889 B1 | * | 2/2001 | Byrne | .......................... | 454/184 |
| 6,236,564 B1 | * | 5/2001 | Fan | .............................. | 361/695 |
| 6,313,989 B1 | * | 11/2001 | Kuang | ......................... | 361/695 |
| 6,317,320 B1 | * | 11/2001 | Cosley et al. | ............... | 361/695 |
| 6,356,438 B1 | * | 3/2002 | Leman et al. | ............... | 361/695 |

FOREIGN PATENT DOCUMENTS

JP          57-6296       * 11/1986     ................. 361/695

* cited by examiner

*Primary Examiner*—Gregory Thompson

(57) ABSTRACT

A movable mechanism for using with an electrical apparatus, in which the electrical apparatus has a casing having a receptacle for mounting therein the movable mechanism, to be dissipated by at least one heat-dissipating device installed in the movable mechanism. The movable mechanism includes a housing pivotally connected to the electrical apparatus in receptacle and having a slit for replaceably inserting therein the at least one heat-dissipating device.

5 Claims, 4 Drawing Sheets

MOVABLE MECHANISM FOR USING WITH ELECTRICAL APPARATUS TO BE DISSIPATED

FIELD OF THE INVENTION

The present invention relates to a movable mechanism for using with an electrical apparatus to be dissipated by a heat-dissipating device installed in the movable mechanism, and more particularly to a movable mechanism for using with a systemic host.

BACKGROUND OF THE INVENTION

A heat-dissipating device is an essential accessory device for a systemic host, because it can assure that the systemic host is operated at a normal temperature to avoid the systemic host crashing due to high temperature. Thus, the heat-dissipating device is very important for the systemic host such as a server that has to be operated for a long time and cannot be rashly shut down. If the heat-dissipating device is broken down, they should be easily replaced or repaired when the systemic host is at a normal working status. Therefore, an ideal heat-dissipating device could be repaired and maintained without disassembling the systemic host and be proceeded by hot swap to avoid the systemic hot shutting down.

However, the typical heat-dissipating device is fixed in the interior of the systemic host, which resulting in the maintaining difficulties. Thus, once the heat-dissipating device is out of order, e.g. the heat-dissipating fan is broken down, the systemic host has to be disassembled for replacing the unit. Furthermore, for system security consideration, the systemic host has to be shut down before disassembling. Therefore, it is really inconvenient and time-consuming.

Therefore, the purpose of the present invention is to develop a movable mechanism without taking additional space to deal with the above situations encountered in the prior art.

SUMMARY OF THE INVENTION

It is therefore an object of the present invention to propose a movable mechanism of a heat-dissipating device for easy maintaining without shutting down the systemic host.

It is therefore another object of the present invention to propose a movable mechanism of a heat-dissipating device for reducing the maintaining time and cost.

It is therefore an additional object of the present invention to propose a movable mechanism of a heat-dissipating device for proceeding the hot swap while the heat-dissipating device is broken down.

According to one aspect of the present invention, there is provided a movable mechanism for using with an electrical apparatus, in which the electrical apparatus has a casing having a receptacle for mounting therein the movable mechanism, to be dissipated by at least one heat-dissipating device installed in the movable mechanism. The movable mechanism includes a housing pivotally connected to the electrical apparatus in receptacle and having a slit for replaceably inserting therein the at least one heat-dissipating device.

Certainly, the movable mechanism can further comprise at least one connector electrically connected to the electrical apparatus for connecting a corresponding connector of the at least one heat-dissipating device to be power-supplied by the electrical apparatus.

Certainly, the electrical apparatus can be a systematic host or a server.

Preferably, the housing is pivotally connected to the electrical apparatus in the receptacle by a pivot.

Certainly, the housing can include two cages connected in series, each of which has a heat-dissipating device slit for replaceably inserting therein a corresponding heat-dissipating device.

Certainly, the housing can be fixed in the electrical apparatus by screwing or by buckling at a closed status.

Certainly, the heat-dissipating device can be a heat-dissipating fan. The heat-dissipating device can be replaced by a hot swap process.

According to another aspect of the present invention, there is provides an electrical apparatus having a casing having a receptacle for mounting therein a movable mechanism having a housing having a slit for replaceably inserting therein at least one heat-dissipating device for dissipating the electrical apparatus.

Certainly, the movable mechanism can further comprise at least one connector electrically connected to the electrical apparatus for connecting a corresponding connector of the at least one heat-dissipating device to be power-supplied by the electrical apparatus.

Certainly, the electrical apparatus can be a systematic host or a server.

Preferably, the housing is pivotally connected to the electrical apparatus in the receptacle by a pivot.

Certainly, the housing can include two cages connected in series, each of which has a heat-dissipating device slit for replaceably inserting therein a corresponding heat-dissipating device.

According to an additional aspect of the present invention, there is provides a movable mechanism for using with an electrical apparatus to be dissipated by plural heat-dissipating devices installed in the movable mechanism. The movable mechanism includes plural cages connected in series and pivotally connected to the electrical apparatus, each of the cages has a slit for replaceably inserting therein a corresponding heat-dissipating device.

The present invention may best be understood through the following description with reference to the accompanying drawings, in which:

DETAILED DESCRIPTION OF THE PREFERRED EMBODIMENTS

Figure 1:
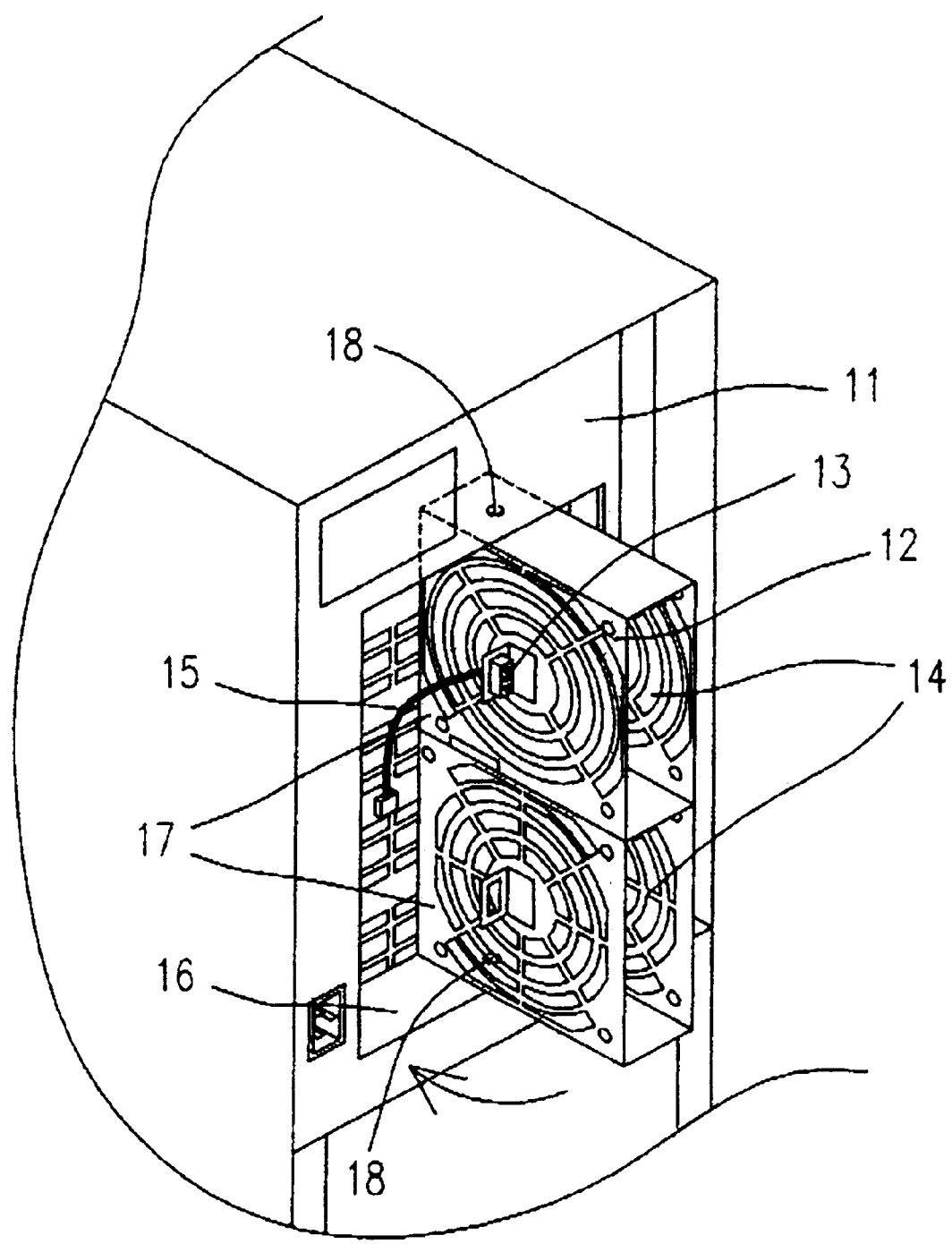
FIG. 1 is a diagram illustrating a movable mechanism of a heat-dissipating device at open state according to the preferred embodiment of the present invention.

FIG. 1 is a diagram illustrating a movable mechanism of a heat-dissipating device at open state according to the present invention. The movable mechanism 12 is used with a systemic host 11 having a casing having a receptacle 16 for mounting therein the movable mechanism 12 and is opened via a pivot 18. The movable mechanism 12 has a housing having two cages 17 pivotally connected to the systemic host 11 and two slits 14 for inserting two heat-dissipating devices therein. Each cage 17 has a connector 13 electrically connected to the systemic host 11 by a wire 15.

Figure 2:
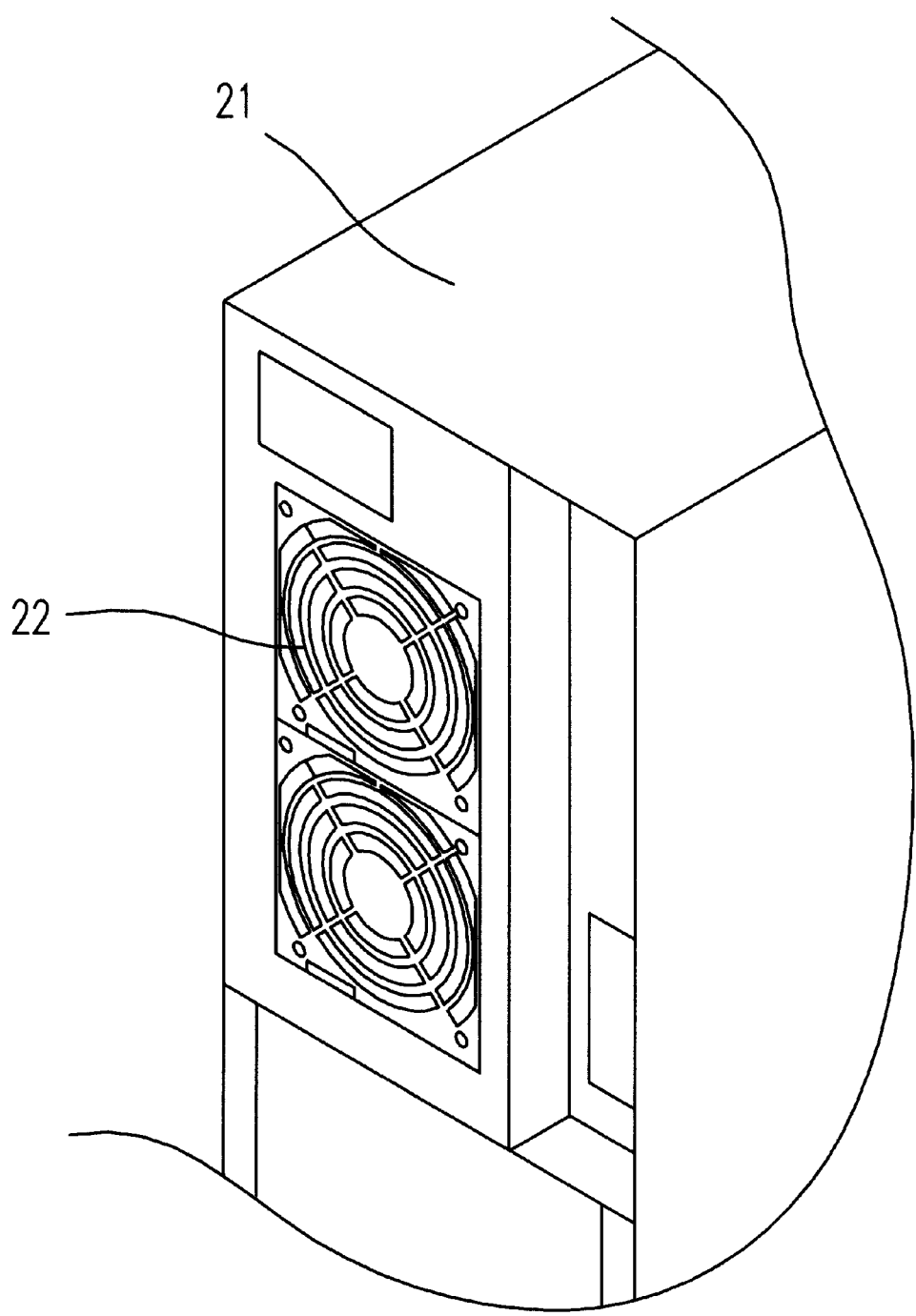
FIG. 2 is a diagram illustrating the movable mechanism for placing a heat-dissipating device at a closed state according to the present invention.

FIG. 2 is a diagram illustrating the movable mechanism of a heat-dissipating device at a closed state according to the present invention. The movable mechanism 22 can be fixed in the systemic host 21 by screwing or buckling (not shown) when it is at the closed state as shown in FIG. 2.

Figure 3A:
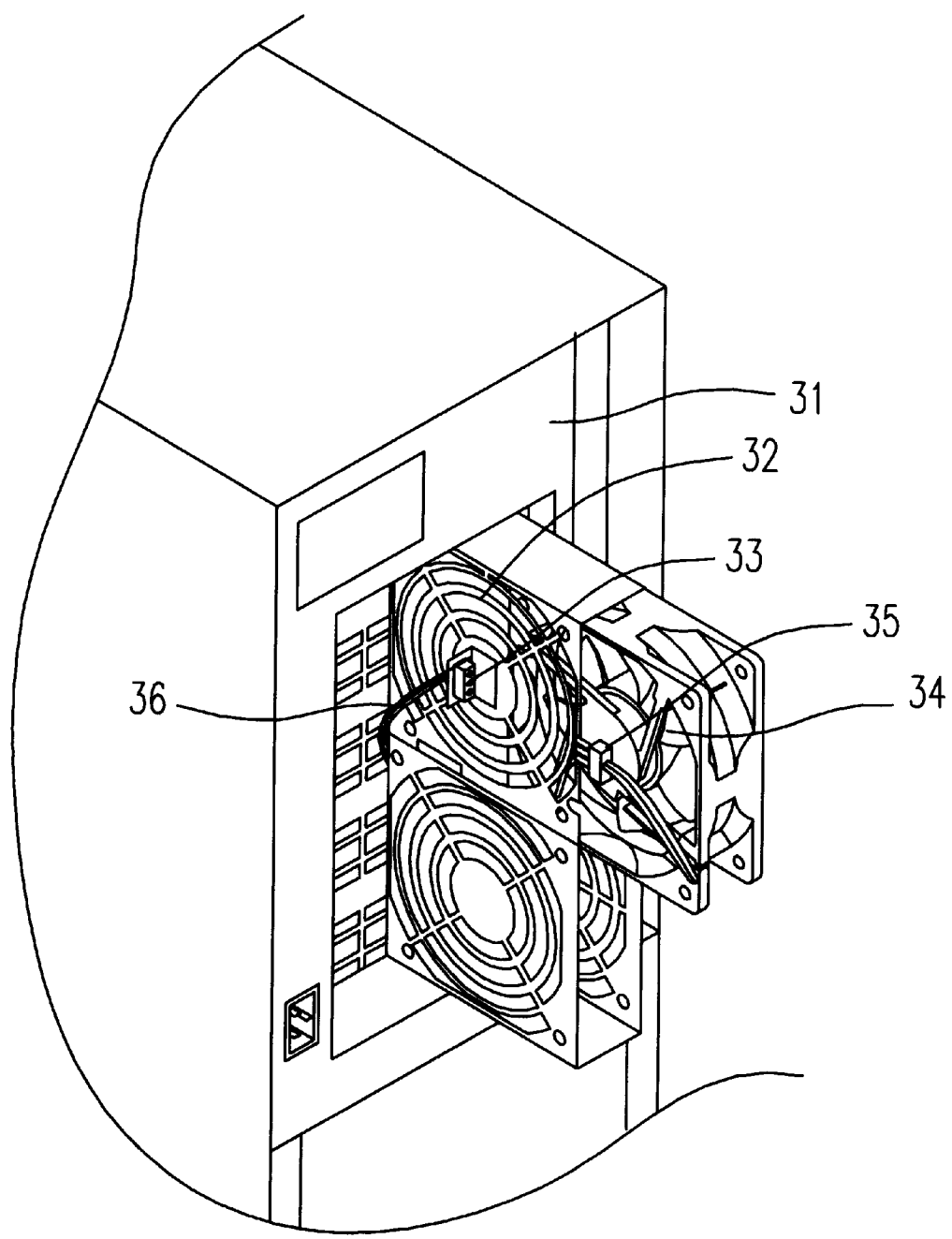
FIGS. 3A–3B are diagrams illustrating a heat-dissipating fan inserted into the movable mechanism according to the present invention.
Figure 3B:
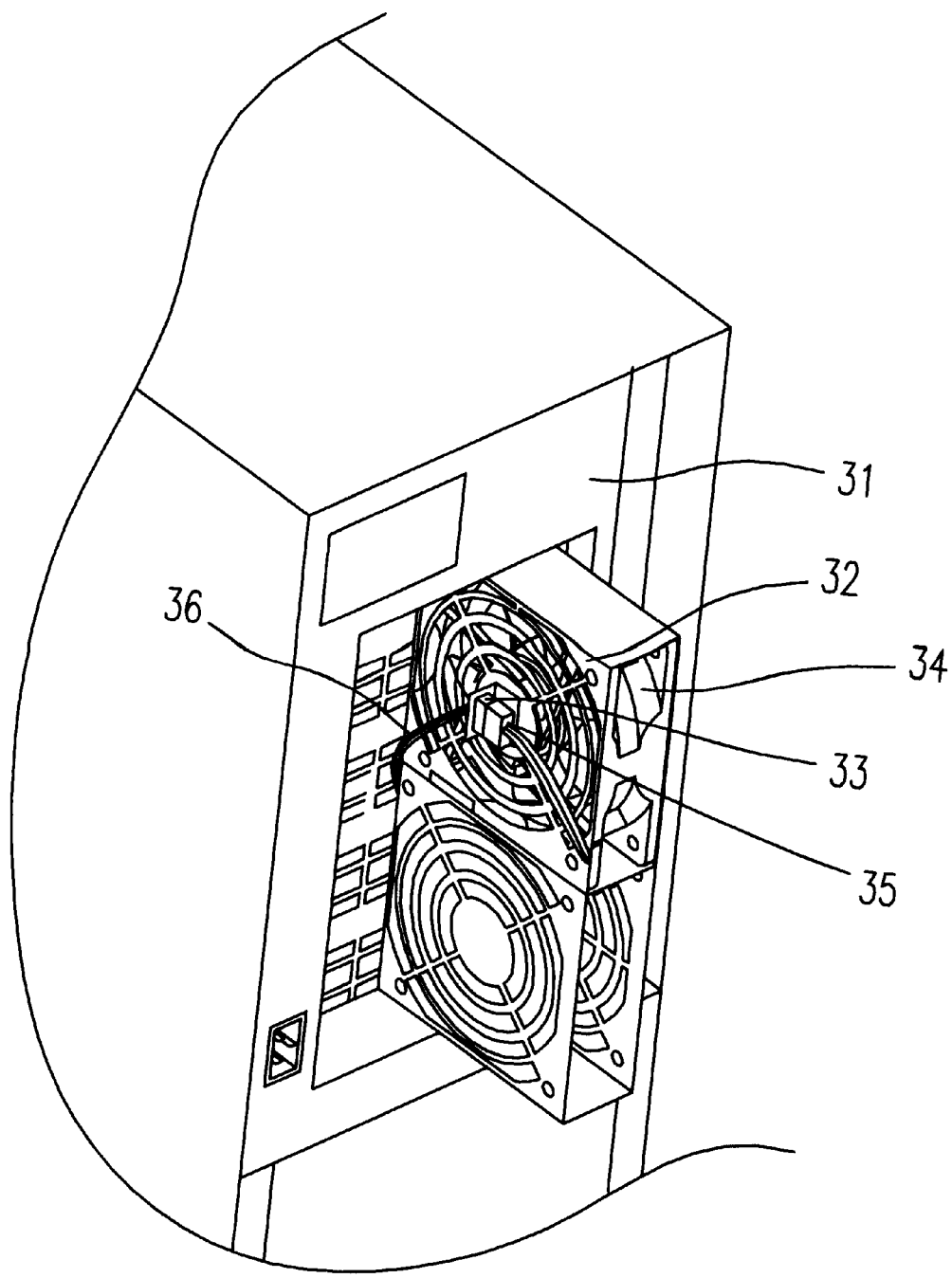

FIGS. 3A–3B are diagrams illustrating a heat-dissipating fan inserted into the movable mechanism according to the present invention. The heat-dissipating fan 34 is inserted into the movable mechanism 32. As shown in FIG. 3A, the connector 33 of the movable mechanism 32 is electrically connected to the systemic host 31 via a wire 36 and a fan connector 35 of the heat-dissipating fan 34 for controlling the rotation of the heat-dissipating fan. FIG. 3B is a diagram illustrating a heat-dissipating fan 34 is disposed in the movable mechanism 32.

The present invention provides a movable mechanism that can be on-line replaced. For example, in the embodiment, two heat-dissipating fans are established in the movable mechanism. If the heat-dissipating fan is broken down, the movable mechanism could be opened to directly replace the damaged fan with a new one without shutting down the machine. Certainly, the number of the cages in the movable mechanism of heat-dissipating device is dependent on the particular demand without affecting the convenience for maintaining.

In sum, the movable mechanism for the heat-dissipating device of the present invention has advantages of easy establishment, low cost, easy maintainment and convenience.

While the invention has been described in terms of what are presently considered to be the most practical and preferred embodiments, it is to be understood that the invention need not to be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A combination including a movable mechanism installing therein plural heat-dissipating devices for dissipating heat from an electrical apparatus which has a casing having a receptacle for mounting therein said movable mechanism, the movable mechanism comprising a housing pivotally connected to said electrical apparatus, wherein said housing has plural cages, and wherein each of said cages has a slit for on-line replaceably inserting therein a corresponding said heat-dissipating device.

2. The combination according to claim 1, further comprising plural connector for electrically connecting said plural heat-dissipating device to said electrical apparatus, such that said plural heat-dissipating device are power-supplied by said electrical apparatus.

3. The combination according to claim 1, wherein said housing is pivotally connected to said electrical apparatus by a pivot.

4. The combination according to claim 1, wherein said heat-dissipating device is a heat-dissipating fan.

5. The combination according to claim 1, wherein said electrical apparatus is one of a systematic host and a server.

\* \* \* \* \*